United States Patent [19]
Phillips et al.

[11] Patent Number: 5,671,234
[45] Date of Patent: Sep. 23, 1997

[54] PROGRAMMABLE INPUT/OUTPUT BUFFER CIRCUIT WITH TEST CAPABILITY

[75] Inventors: Christopher E. Phillips, San Jose; Michael G. Ahrens, Sunnyvale; Joseph G. Nolan, III; Laurence H. Cooke, both of San Jose, all of Calif.

[73] Assignee: Crosspoint Solutions, Inc., Milpitas, Calif.

[21] Appl. No.: 78,692

[22] Filed: Jun. 17, 1993

Related U.S. Application Data

[62] Division of Ser. No. 718,677, Jun. 21, 1991, Pat. No. 5,221,865.

[51] Int. Cl.$^6$ .................................................. G01R 31/28
[52] U.S. Cl. ................ 371/22.3; 327/310; 327/379; 327/391; 326/63; 326/68
[58] Field of Search ........................ 371/22.3, 22.1, 371/18; 365/201, 189, 174, 179; 324/73.1; 307/288, 313, 576, 496, 456, 451; 327/427, 445, 310, 313, 379, 389, 391, 328; 326/62, 63, 68, 48

[56] References Cited

U.S. PATENT DOCUMENTS

| | | | |
|---|---|---|---|
| 4,040,015 | 8/1977 | Fukuda | 340/173 |
| 4,446,536 | 5/1984 | Rodgers | 365/230 |
| 4,574,273 | 3/1986 | Atsumi et al. | 307/475 |
| 4,638,187 | 1/1987 | Boler et al. | 307/451 |
| 4,701,921 | 10/1987 | Powell et al. | 371/25 |
| 4,791,323 | 12/1988 | Austin | 307/475 |
| 4,859,873 | 8/1989 | O'Shaughnessy et al. | 307/290 |
| 4,912,348 | 3/1990 | Maki et al. | 307/465 |
| 4,928,023 | 5/1990 | Marshall | 307/443 |
| 4,959,561 | 9/1990 | McDermott et al. | 327/313 |
| 4,978,905 | 12/1990 | Hoff et al. | 307/296.8 |
| 5,095,523 | 3/1992 | Delaruelle et al. | 395/800 |
| 5,130,647 | 7/1992 | Sakashita et al. | 324/158 R |
| 5,210,759 | 5/1993 | DeWitt et al. | 371/22.3 |
| 5,260,949 | 11/1993 | Hashizume et al. | 511/22.3 |

OTHER PUBLICATIONS

Electronic Circuit Design, Savant, Roden, Carpenter, The Benjamin/Cummings Publishing Company, Inc., 1987, pp. 721–726.

*Primary Examiner*—Robert W. Beausoliel, Jr.
*Assistant Examiner*—Trinh L. Tu
*Attorney, Agent, or Firm*—Townsend and Townsend and Crew LLP

[57] ABSTRACT

An integrated circuit having system logic with programmable elements, decoding logic coupled to the programmable elements for addressing the programmable elements and a plurality of input/output buffer circuits for passing signals between the system logic and the exterior of the integrated circuit through input/output terminals is disclosed. Each input/output buffer circuit comprises an output driver stage having an output terminal connected to an input/output terminal; and a plurality of cells, each cell having a multiplexer, a flip-flop connected to an output terminal of the first multiplexer for storing a signal from the first multiplexer, a latch connected to an output terminal of the flip-flop for storing a signal from the flip-flop, and a second multiplexer connected to an output terminal of the latch. The cells connected to each other and cells of other input/output buffer circuits from an output terminal of the flip-flop of one cell to a first input terminal of a first multiplexer of another cell for serial scanning of signals through the cells to test the system logic. Control lines are connected to the output terminals of the latch of the cells and to the decoding logic coupled to the programmable elements so that the programmable elements can be addressed for programming by serially scanning control signals through the cells.

12 Claims, 7 Drawing Sheets

PROGRAMMABLE INPUT/OUTPUT BUFFER CIRCUIT WITH TEST CAPABILITY

This is a Division of application Ser. No. 07/718,677 filed Jun. 21, 1991, which issued as U.S. Pat. No. 5,221,865 on Jun. 22, 1993.

BACKGROUND OF THE INVENTION

The present invention is related to input/output buffer circuits in integrated circuits and, more specifically, to buffer circuits which have various optionally programmable operating characteristics and which have certain test capabilities.

In an integrated circuit, input\output buffer circuits lie electrically between the rest of the integrated circuit and the external environment, i.e., the system in which the integrated circuit is placed. As the name implies, these circuits "buffer" or condition signals from the external environment to the integrated circuit and signals from the integrated circuit to the external environment. In nearly all integrated circuits these buffer circuits are designed with a particular external environment in mind. Thus a redesign is required if the integrated circuit is to be relocated in a different system having different requirements. It is highly desirable that input/output buffer circuits be easily adaptable to different external environments.

Furthermore, a recent requirement upon input/output buffer circuits is testability. As integrated circuits and the systems in which they are located have become more complex and densely packed, the testing of the integrated circuits have become more complex and difficult. One proposed solution is the IEEE standard 1149.1 for boundary scan testing in which the input/output buffer circuits form a serial scan chain over which test data can be passed. Test data can be scanned into the integrated circuit over the serial chain between the buffer circuits, processed by the integrated circuit and then scanned out over the chain. The changes to the processed test data yield the desired test information about the integrated circuit.

However, the IEEE standard 1149.1 requires circuits in the input/output buffer to perform the scanning function which are additional to the circuits for input and output functions. This added "overhead" to an input/output buffer circuit occupies valuable space on the semiconductor substrate on which the integrated circuit is formed and typically slows the operating speed of the buffer circuit.

It is thus desirable that an input/output buffer circuit have circuits which can perform the input/output and the test functions in a consolidated fashion to reduce the space occupied by the buffer circuit and which can function at high speeds so as to avoid any denigration of performance.

The present invention is able to achieve all these goals and more.

SUMMARY OF THE INVENTION

The present invention provides for an integrated circuit having system logic with programmable elements, decoding logic coupled to the programmable elements for addressing the programmable elements and a plurality of input/output buffer circuits for passing signals between the system logic and the exterior of the integrated circuit through input/output terminals. Each input/output buffer circuit comprises an output driver stage having an output terminal connected to an input/output terminal; and a plurality of cells, each cell having a first multiplexer, a flip-flop connected to an output terminal of the first multiplexer for storing a signal from the first multiplexer, a latch connected to an output terminal of the flip-flop for storing a signal from the flip-flop, and a second multiplexer connected to an output terminal of the latch. The cells connected to each other and cells of other input/output buffer circuits from an output terminal of the flip-flop of one cell to a first input terminal of a first multiplexer of another cell for serial scanning of signals through the cells to test the system logic. Control lines are connected to the output terminals of the latch of the cells and to the decoding logic coupled to the programmable elements so that the programmable elements can be addressed for programming by serially scanning control signals through the cells.

Each input/output buffer circuit has a programming unit which is connected to the control lines from the latches of the cells. Through these control lines the programming unit can also be programmed to set the drive characteristics of the output driver stage.

The input/output buffer circuit has also many other useful features, including special test pads which are connected to the bonding pads which handle the serial scan test signals and power. Located in the corner(s) of the integrated circuit die, the test pads can be probed for testing of the integrated circuit while the die is still part of a wafer without touching the bonding pads.

Other useful features include special circuits which can act as multiplexers and level-shifters without any significant loss in speed.

BRIEF DESCRIPTION OF THE DRAWINGS

A detailed understanding of the present invention may be attained by a perusal of the following Description of the Specific Embodiments with reference to the drawings below.

DETAILED DESCRIPTION OF PREFERRED EMBODIMENTS

Figure 1:
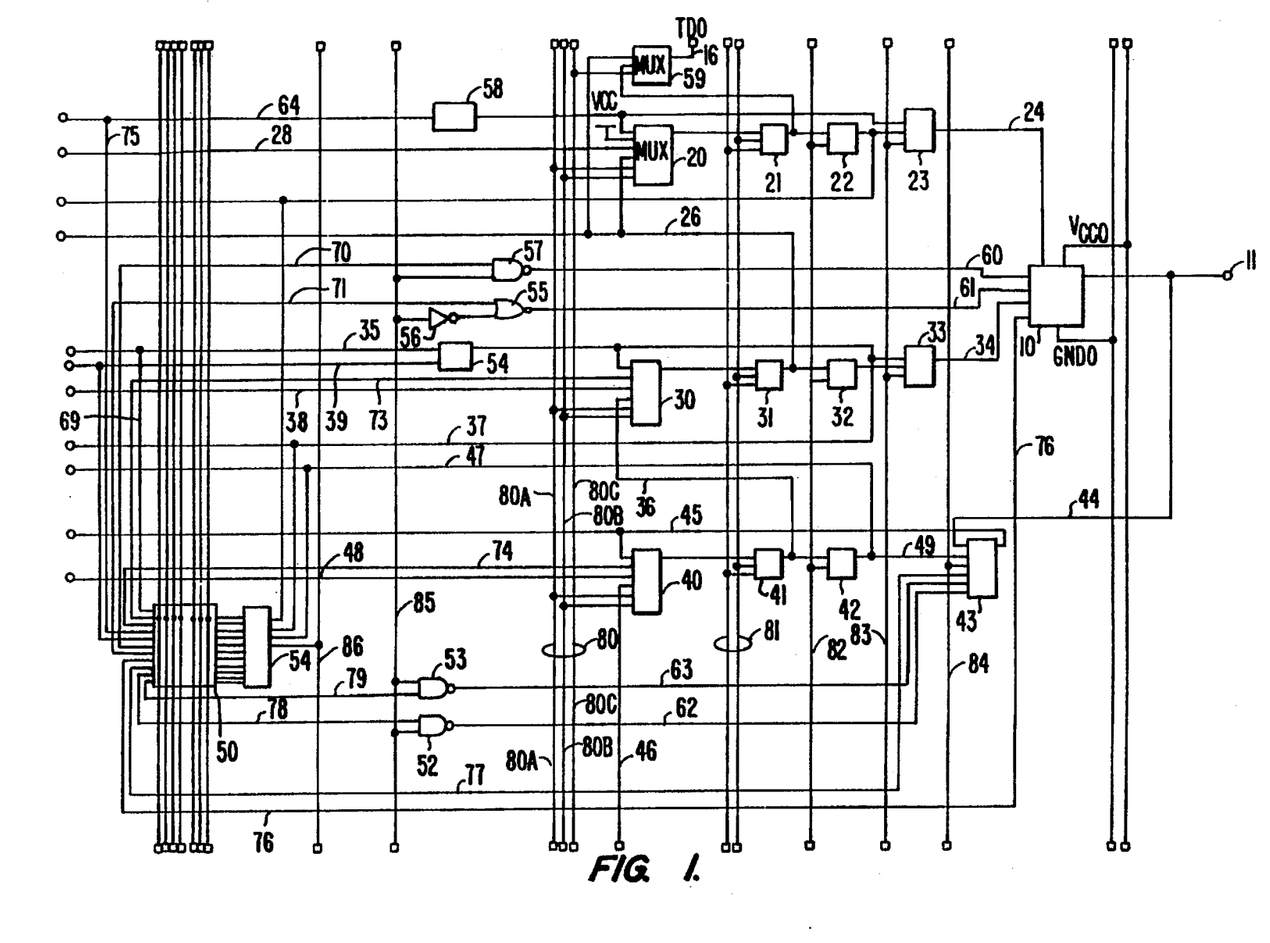
FIG. 1 is block diagram of an input/output buffer circuit according to the present invention.

FIG. 1 is an general block circuit diagram of the an input/output buffer circuit according to the present invention. It should be noted that although the buffer circuit is described in the context of field programmable gate array (FPGA) integrated circuits, one skilled in the field of integrated circuit design would readily appreciate the applicability of the present invention to other types of integrated circuits.

As explained in greater detail below, the input/output buffer circuit can act as an output buffer to transmit data signals from the rest (interior) of the integrated circuit to the outside environment. The input/output buffer circuit can act as an input buffer to transmit data signals from the outside environment to the interior, or system logic, of the integrated circuit. As the data signals move through the buffer circuit, the buffer circuit also shifts the voltage levels of the signals for operation in the interior of the integrated circuit and for operation in the outside environment.

The input/output buffer circuit can also operate under the IEEE standard 1149.1. In this mode of operation the buffer circuit, which is connected to other input/output buffer circuits, can transmit signals between the buffer circuits in a serial chain. In a sense, signals in this mode of transport travel perpendicularly to the direction of data signals to and from the interior of the integrated circuit. These serial chain signals may be test data signals under the IEEE test standard, or may be signals useful in programming the integrated circuit, including the input/output buffer circuit itself.

Besides signals from the scanning operation along the chain of input/output buffer circuits, the buffer circuit can acquire signals from locations in the system logic of the integrated circuit other than where the test data signals are acquired, from the external environment, and from the input/output buffer circuit itself. Such flexibility permits the input/output buffer circuit to perform a host of functions, as explained below.

The buffer circuit of FIG. 1 is generally organized with a programming unit 50 and a decoder 51 to program the unit 50, an output driver stage 10, and three cells, which are combinations of a multiplexer, a flip-flop, a latch and a second multiplexer.

The programming unit 50 contains antifuses which are programmed to set various control lines emanating from the unit 50. The programming unit 50 can be used to set the operational characteristics of the output signals from the input/output buffer circuit and to handle different operational characteristics of the input signals to the input/output buffer circuit. For example, once programmed, the unit 50 sends control signals to the output stage 10 to select a particular drive current and slew rate during an output operation.

A control signal on the line 70 through a NAND gate 57 sends a signal on the line 60 to the output stage 10 so that the output drive current is set at a particular value, 4 mA, in this case. A control signal on the line 71 passes through a NOR gate 55 to generate a control signal on the line 61 so that the output stage 10 generates a higher output current, 8 mA. An output current of 12 mA is also possible with a combination of control signals. The programming unit 50 also controls the slew rate of the output driver stage 10 by a control line 76.

Other control lines from the programming unit 50 include a control line 75 connected to a control line 64, a level shifter 58, a multiplexer 23 and a line 24. When set, the control line 75 disables the output driver stage 10, i.e. the stage 10 is placed in a state of high impedance. A control line 69, which is connected to a data out line 35 (and line 34) can pull the line 35 high or low depending upon how the programming unit 50 is set. Thus, together with the operation of the control line 75, which can be set to carry clock signals, as explained below, the output driver stage 10 can be set in an "open source" or "open drain" mode, i.e., either logic high/high impedance or logic low/high impedance.

Control lines 73 and 74 are connected to input terminals of multiplexers 30 and 40 respectively. These control lines 73 and 74 provide access to the programmable bits in the unit 50. As explained in greater detail below, these programmable bits may used by the manufacturer or user of the integrated circuit to store information.

Control lines 77, 78 and 79 carry signals from the programming unit 50 to control the mode of operation of a multiplexer 43, as explained below.

In its output operation, the output driver stage 10 transmits signals on the line 34 from a multiplexer 33 to an input/output terminal 11. Typically the terminal 11 is an input/output bonding pad of the integrated circuit. Depending upon the selection of the multiplexer 33, the signal on the line 34 could be data signal on a data out line 35 through a latch 54 or a signal from a latch 32. As explained above, the output driver stage 10 is programmable so that different currents and slew rates are available through the control lines 60, 61 and 76 to drive the terminal 11 for output operation or to place the terminal 11 in a high impedance state through the line 24.

The first cell, or multiplexer-flip-flop-latch-multiplexer combination, has a 4-to-1 multiplexer 20 which has its output terminal connected to an input terminal of a flip-flop 21. The output terminal of the flip-flop 21 is connected to an input terminal of a latch 22 which, in turn, has its output terminal connected to an input terminal of the 2-to-1 multiplexer 23. The output terminal of the multiplexer 23 is connected by the line 24 to an input terminal of the output stage 10.

The four input terminals of the multiplexer 20 are connected to an output terminal of the level shifter 58, a logic "1" state generator, here the voltage supply at $V_{CC}$, a line 28 which is connected to a node in the interior of the integrated circuit, and a line 26 connected to an output terminal of a flip-flop 31 belonging to the second multiplexer-flip-flop-latch-multiplexer combination described below. The multiplexer 20 is also connected to control lines 80A and 80B (two of three Select Data Register control lines), which determine which of the four input terminals is selected.

The flip-flop 21 is connected to two clock lines 81A and 81B (Clock Data control lines), which normally run in complementary fashion. As described later, the clock lines 81A and 81B can also operate in other modes including a pass-through mode by which signals pass directly from the input terminals to the output terminals of the flip-flops 21. Besides the input terminal of the latch 22, the output terminal of the flip-flop 21 is connected to an input terminal of a 2-to-1 multiplexer 59. The second input terminal of the multiplexer 59 is connected to a line 27 which is connected to the output terminal of the latch 22 and to a node in the interior of the integrated circuit. The latch 22 is also connected a control line 82 (Update Register control line).

Besides the output terminal of the latch 22, the 2-to-1 multiplexer 23 of the first combination is connected the output terminal of the level shifter 58 and a control line 83 (Output Mode control line) over which selection signals are transmitted.

Similarly, the second cell has a 4-to-1 multiplexer 30 which has its output terminal connected to an input terminal of the flip-flop 31. The output terminal of the flip-flop 31 is connected to an input terminal of a latch 32 which, in turn, has its output terminal connected to an input terminal of a 2-to-1 multiplexer 33. The output terminal of the multiplexer 33 is connected by the line 34 to an input terminal of the output stage 10.

The four input terminals of the multiplexer 30 are connected to an output terminal of the latch 54, the control line 73, a line 38 connected to a node in the interior of the integrated circuit, and a line 36 connected to the output terminal of a flip-flop 41 belonging to the third combination. Like the multiplexer 20, the multiplexer 30 is connected to the control lines 80A and 80B.

The flip-flop 31 is connected to the control lines 81A and 81B like the flip-flop 21 of the first combination. Similarly, the latch 32 is connected to the control line 82 like the latch 22 and the 2-to-1 multiplexer 33, which has another input terminal connected to the output terminal of the latch 54, is connected to the control line 83 like the multiplexer 23.

The third cell is somewhat different from the other two cells. Like the other multiplexers of the first two cells, a 4-to-1 multiplexer 40 of the third cell has its output terminal connected to a flip-flop 41 which has its output terminal connected to an input terminal of a latch 42. The output of the latch 42 is connected to an input terminal of a programmable 2-to-1 multiplexer 43.

The four input terminals of the multiplexer 40 are connected to a data input line 45 leading to the system logic of the integrated circuit, the control line 74 from the programming unit 50, a line 48 from a node in the interior of the integrated circuit, and a line 46. As in the case of the multiplexers 20 and 30, the multiplexer 40 is connected to the control lines 80A and 80B for selection of input terminals. Similarly the flip-flop 41 is connected to the control lines 81A and 81B, and the latch 42 is connected to the control line 82.

The multiplexer 43 differs from the multiplexers 23 and 33. The output terminal of the multiplexer 43 is connected, not to the output driver stage 10, but rather to the interior of the integrated circuit by the line 45. One input terminal of the multiplexer 43 is connected to the output terminal of the latch 42, but the second input terminal is connected to the input/output terminal 11 by a line 44. The multiplexer 43 is connected to a control line 84 (Input Mode control line) carries signals to put multiplexer 43 into a high impedance condition. The multiplexer 43 is also connected to the control lines 62, 63 and 77. Signals on the control line 62 determine whether the input terminal connected to the terminal 11 or the input terminal connected to the latch 42 is selected. If the terminal 11 is selected, the control signals on the line 63 determine whether the multiplexer 43 operates at TTL (Transistor-Transistor Logic) levels or at CMOS (Complementary Metal-Oxide-Semiconductor) transistor levels. Signals on the control line 77 determine whether the terminal 11 has a pullup or not.

The control lines 80 (80A–80C), 81 (81A–81B), 82, 83 and 84 carry signals from control logic in the integrated circuit. Such logic may be designed by a person skilled in integrated circuit design to operate with the present invention as described above and according to the requirements of the particular integrated circuit. However, the present invention is also being described in the context of the IEEE 1149.1 standard. Thus the control logic is constrained by the specifications of the standard.

Thus on an integrated circuit using the input/output buffer circuit of the present invention, the buffer circuit is typically replicated for each input/output terminal. The input buffer circuits are connected in common to the previously described control lines 80–85. Furthermore, the line 46, which is connected to an input terminal of the multiplexer 40, of one input/output buffer circuit is connected to the corresponding line 16 of a neighboring input/output buffer circuit. Likewise, the line 16 of the first input/output buffer circuit is connected to the corresponding line 46 of a second neighboring input/output buffer circuit.

During operation, signals are transferred through the input/output buffer circuit of FIG. 1 in many ways. For incoming data signals, the data signal from the terminal 11 travels through the line 44 to the multiplexer 43. With an input mode selected by a control signal on the line 84, the data signal passes through the multiplexer 43 to the line 45 and on the rest of the integrated circuit. Output data signals travel from the interior of the integrated circuit on the line 35 to the latch 54, which is clocked by signals on a line 39. The output data signals from the latch 54 are passed to the multiplexer 33, which by an output mode selection signal on the control line 83 sends the output data signals to the output driver stage 10. It should be noted that the latch 54 can be set to hold or pass the data signals by a signal on the control line 72 from the programming unit 50.

In the particular embodiment of the described input/output buffer circuit, the interior, or system logic, of the integrated circuit operates at reduced CMOS logic levels, i.e., between 0 to +3.5 volts. The power supply is accordingly reduced. For communicating to the exterior world, the interior signals are level-shifted from reduced CMOS to full CMOS logic levels, i.e., 0 to +5 volts. Hence as shown in FIG. 1, the level shifter 58 is placed between the control line 64 and the multiplexer 23. NAND gate 57, NOr gate 55, latch 54 and NAND gates 52 and 53 also perform level-shifting functions. As described blow, signals also move through the input/output buffer circuit for serial scan testing. These signals are at full CMOS logic levels as specified in the IEEE 1149.1 standard.

Signals can also move through the input/output buffer circuit in the IEEE standard 1149.1 test mode. In this mode, test data signals travel to the line 46 (TDI in the terminology of the standard) from the corresponding line 16 (TDO in the terminology of the standard) of a neighboring input/output buffer circuit. The test data can be serially scanned through each input/output buffer circuit by the movement of data through the multiplexer 40, the flip-flop 41, and the line 36 to the multiplexer 30. Then the data continues through the flip-flop 31 and line 26 to the multiplexer 20. From the multiplexer 20 the data travels through the flip-flop 21 and the multiplexer 59 to the next input/output buffer circuit on the line 16.

For a test of the integrated circuit the test data are scanned in serially as described, sent into the system logic of the integrated circuit on the line 45 of each input/output buffer circuit, processed by the integrated circuit, and read out on the line 35 of each input/buffer circuit. The processed test data are then scanned out serially and compared with expected test data. All of these operations are described in the specification of the IEEE 1149.1 standard.

With the present invention, signals can be serially scanned through the input/output buffer circuits for purposes other than test. For example, control signals may be moved along the serial scan path described above until the each control signal is in the flip-flops 21, 31, and 41 of each input/output buffer circuit. Then the latches 22, 32 and 42 are enabled to respectively transmit the signals on the lines 27, 37 and 47 to the interior of the integrated circuit, which contains a programmable logic array. These control signals are received by decoding logic (not shown) which address the programmable elements in the array for programming. The programmable logic array and its programming operation contemplated by this embodiment of the present invention is described in U.S. Ser. No. 07/671,222, entitled "A FIELD PROGRAMMABLE LOGIC ARRAY," filed Mar. 18, 1991 by Laurence H. Cooke and David Marple, and assigned to the present assignee.

Besides programming the logic array of the interior, control signals in the latches 22, 32 and 42 are used to program the programming unit 50 in the input/output buffer circuit itself. Each of the control lines 27, 37 and 47 leads not only to the interior of the integrated circuit but also to the decoder 51 which addresses the particular programmable elements in the unit 50. Together with a control line 86, the lines 27, 37, and 47 allows the decoder 51 to perform a 4-to-11 selection for programming the unit 50. The control line 50 is connected to a decoder for the Instruction Register defined by the IEEE 1149.1 standard. Since the Instruction Register itself is loaded by serial scanning through the TDI terminal, the programming of the unit 50 is defined completely by the serial scanning signals. The self-programming operation is detailed in the description of the programming unit 50 below.

Of course, one skilled in integrated circuit design would readily appreciate other applications besides the programming of the programmable logic array described above or the self-programming of the input/output buffer circuit.

It should be noted that signals, data or otherwise, may be received by the input/output buffer circuit from the terminal 11, through the multiplexer 43 and line 45. From the line 45, the signals are received by the multiplexer 40 and stored in the flip-flop 41. From here the signals may be serially scanned as described for the test data signals.

The input/output buffer circuit may also receive signals in other ways. The lines 28, 38 and 48 are connected to various nodes in the system logic of the integrated circuit. By appropriate signals on the control lines 80A and 80B, the logic states at these nodes are read out through the multiplexers 20, 30 and 40. These signals may then be scanned out serially as described for the IEEE standard test data or read out sequentially through the flip-flop 31, latch 32, multiplexer 33 and output stage 10 of each of the input/output buffer circuits. One skilled in the field of integrated circuit design should readily appreciate the benefits of such direct access to the system logic of an integrated circuit.

The multiplexers 30 and 40 also have one of their input terminals connected to the programming unit 50 by the lines 73 and 74. Upon the proper signals on the control lines 80, a bit of information stored in the programming unit 50 is respectively loaded into the flip-flops 31 and 41. At the same time a logic "1" from the input terminal of the multiplexer 20 connected to the $V_{CC}$ power supply is loaded into the flip-flop 21. The two storage locations in the programming unit 50 are part of registers which are defined in the IEEE test specification. Each input/output buffer circuit contains a two-bit portion of registers including the Identification Code Register, User Code Register, and User Test Register. Furthermore, the two storage locations may be used for other registers, such as a manufacturing code register.

Figure 7A:
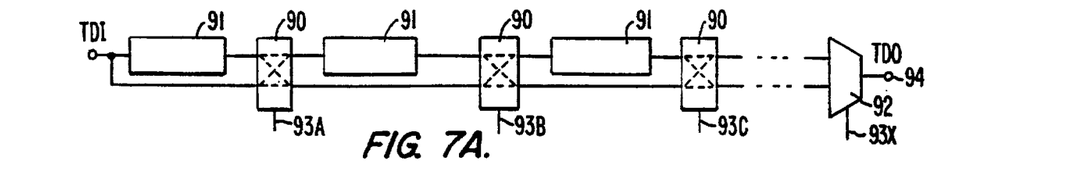
FIG. 7A illustrates how the input/output buffer circuit of the present invention may be connected to other such circuits in an integrated circuit.
Figure 7B:
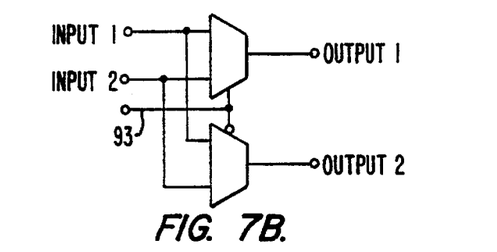
FIG. 7B schematically illustrates a cross-bar switch of FIG. 7A.

Thus the input/output buffer circuits are placed around the periphery of the die on which the integrated circuit is formed. The circuits are connected together to form the scanning chain as described previously. As shown in FIG. 7A, a cross-bar switch 90, which is detailed at the logic level in FIG. 7B, is placed between every 16 input/output buffer circuits, which form the registers 91 with 32 storage locations in the 16 programming units 50. The cross-bar switches 90 receive the data signals on the serial scan chain and, responsive to signals on control line 93A, 93B, etc., either passes the signals to the next 16 input/output buffer circuits in the scan chain or sends the signals to the next cross-bar switch 90. Together with the operation of the cross-bar switches 90 and responsive to selection signal on the control line 93, the output multiplexer 92 selects corresponding register data to be read out through the multiplexer output terminal 94.

It should be noted that the IEEE test specification requires that the Identification Code Register and other registers be 32-bits long. Accordingly the input/output buffer circuit uses only two of the three possible bits. When reading the two bits from the programming unit 50 through the multiplexers 30 and 40, the corresponding input line of the first cell multiplexer 20 is set to logic "1". When the 32 bits of data from neighboring input/output buffer circuits are serially scanned, the control line 80C operates so that the multiplexer 59 selects input signals on the line 26 and avoids the logic "1" held by the flip-flop 21. In this manner each input/output buffer circuit operates with the serial data path from the line 46, through the multiplexer 40, through the flip-flop 41, out to the line 36, through the multiplexer 30 and flip-flop 31, output to the line 26, through the multiplexer 59 and out to the line 16 to the next buffer circuit.

Figure 8:
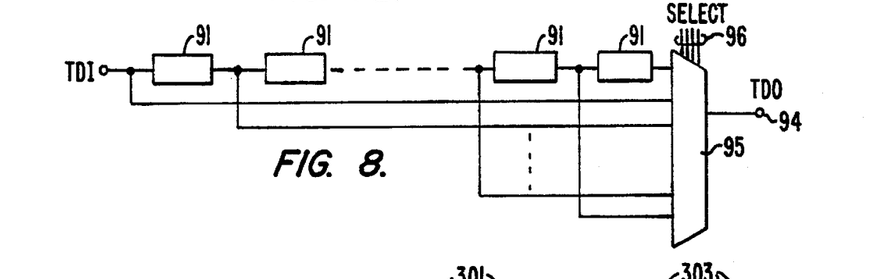
FIG. 8 illustrates an alternative way of connecting the input/output buffer circuits of the present invention in an integrated circuit.

An alternative way of connecting the input/output buffer circuits for a serial scanning chain around the die periphery is illustrated in FIG. 7. In this connection the (TDO) output terminal of each register 91, i.e., group of 16 connected input/output buffer circuits, is connected to an input terminal of a large output multiplexer 95. Responsive to selection signals on control lines 96, the multiplexer 95 selects the register 91 from which to read out the data signals. Compared to the connection illustrated in FIG. 6A, the connection of FIG. 8 requires more conducting lines as one proceeds down the chain toward the output multiplexer 95. This is in contrast to the two conducting paths for the data signals in FIG. 7A.

Figure 2:
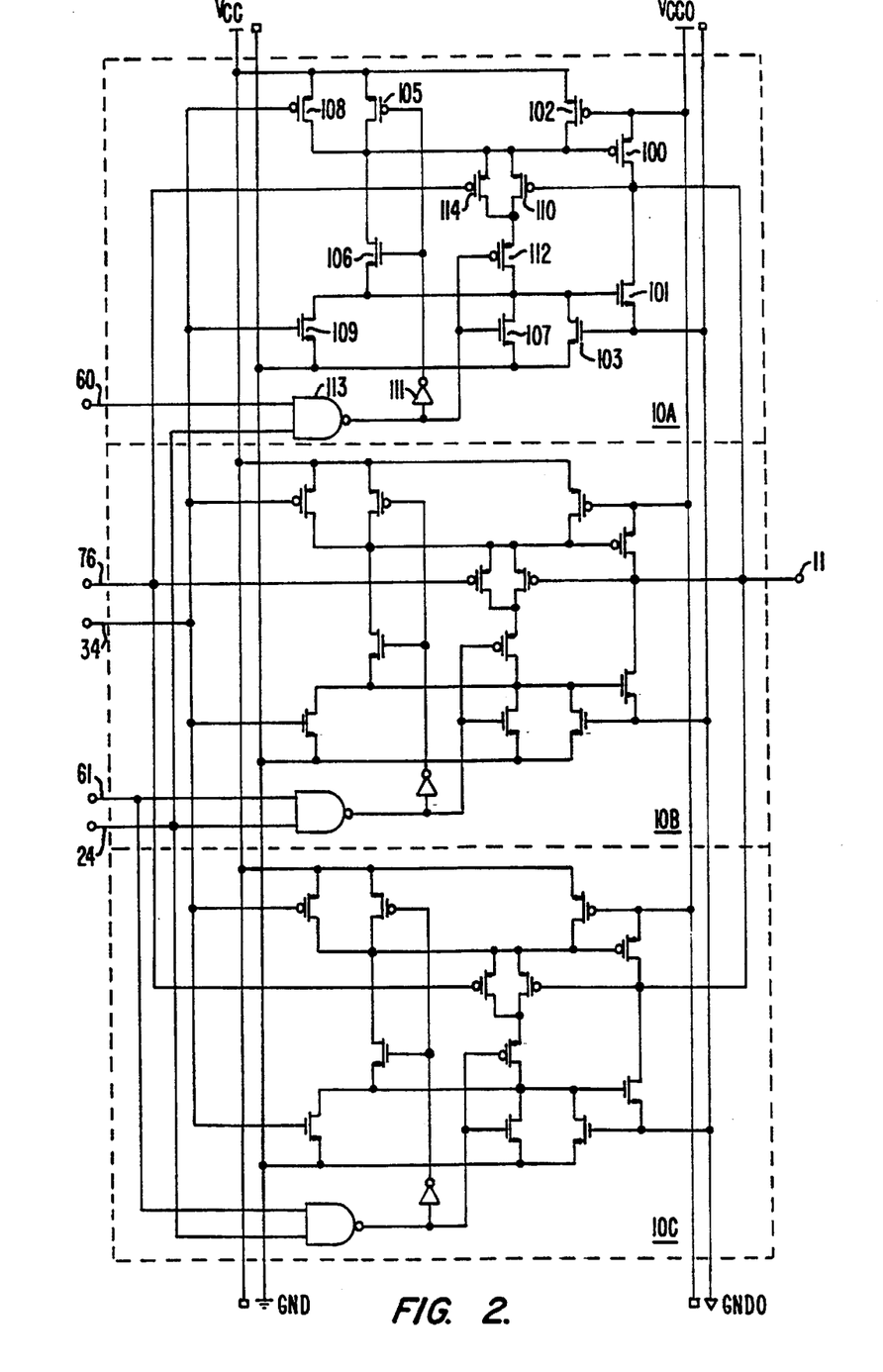
FIG. 2 is a circuit schematic diagram of the output stage of FIG. 1.

FIG. 2 is a detailed schematic diagram of the output driver stage 10. The output driver stage 10 is divided up into three parallel-connected parts, 10A, 10B and 10C. Each part 10A–10C is identical to the other. The large driver transistors are of each part 10A–10C to drive the terminal 11 with 4 mA of drive current. If two parts are enabled, the terminal 11 is driven with 8 mA of drive current. When all three parts are selected, then the terminal 11 is driven with 12 mA of current.

Of course, each part 10A–10C may be designed to drive with different currents. By selecting different combinations of parts, different amounts of drive currents are possible. The output driver stage 10 may also be designed with more (or less) than three parts.

Since the three parts 10A–10C are the same, only part 10A is discussed in detail.

As shown in FIG. 2, the data signal line 34 is connected to the gate electrodes of a complementary pair of data transistors, PMOS transistor 108 and NMOS transistor 109. The source electrode of the PMOS transistor 108 is connected to a power supply at $V_{CC}$ and its drain electrode is connected to the gate electrode of one of the complementary pair of driver transistors, PMOS transistor 100. The drain electrode of the NMOS transistor 109 is connected to the gate electrode of the NMOS driver transistor 101 and its source electrode to a power supply at ground, GND. The drain electrodes of both driver transistors 100 and 101 are commonly connected to the terminal 11. The source electrode of the PMOS driver transistor 100 is connected to a second power supply at $V_{CC0}$ and the source electrode of the NMOS driver transistor 101 is connected to a second power supply at ground GND0. While nominally at $V_{CC}$ and ground respectively, these second power supplies are electrically separated from the $V_{CC}$ and ground power supplies for the reasons below. As shown in FIG. 1, these second power supplies are distributed to each input/output buffer circuit by conducting wires.

The part 10A also has complementary transistors, PMOS transistor 105 and NMOS transistor 107, each of which is respectively connected by their drain electrodes to the gate electrodes of the driver transistors 100 and 101. The gate electrodes of NMOS transistor 107 (and a PMOS transistor 112) is connected to the output terminal of a NAND gate 113 which receives the output enable line 24 and the 4 mA current drive enable line 60 as inputs. The PMOS transistor 105 (and a NMOS transistor 106) is connected to the output terminal of the NAND gate 113 through an inverter 111. The NMOS transistor 106 has one source/drain electrode connected to the gate electrode of the PMOS driver transistor 100 and the other source/drain electrode to the gate electrode of the NMOS driver transistor 101. The PMOS transistor 112 has a drain electrode connected to the gate electrode of the driver transistor 101. The source electrode of the transistor 112 is connected to the drain electrodes of the two parallel PMOS transistors 110 and 114. Both PMOS transistors 110 and 114 have their source electrodes connected to the gate electrode of the PMOS driver transistor 100 and drain electrode of the PMOS data transistor 108. The gate electrode of the PMOS transistor 110 is connected to the input/output terminal 11, while the gate electrode of the PMOS transistor 114 is connected to the slew rate control line 76.

A complementary pair of driver transistor control transistors, PMOS transistor 102 and NMOS transistor 103 are connected, respectively, to the PMOS driver transistor 100 and NMOS driver transistor 101. The PMOS transistor 102 has its source electrode connected to the voltage supply at $V_{CC}$ and its drain electrode connected to the gate electrode of the driver transistor 100. The gate electrode of the transistor 102 is connected to the source electrode of the driver transistor 100 and to the power supply at $V_{CC0}$, which is nominally at the same voltage at $V_{CC}$ but electrically uncoupled from the $V_{CC}$ power supply.

Likewise, the NMOS transistor 103 has its source electrode connected to the power supply at ground (GND) and has its drain electrode connected to the gate electrode of the NMOS driver transistor 101. The gate electrode of the transistor 103 is connected to the source electrode of the PMOS driver transistor 101 and to the power supply at GND0. This GND0 power supply is also nominally at ground but is electrically uncoupled from the GND power supply.

If either of the output enable line 24 or the 4 mA enable line 60 is a logic "0", the part 10A is in a high impedance state. The PMOS transistor 105 and NMOS transistor 107 are turned on, respectively turning off the PMOS driver transistor 100 and the NMOS driver transistor 101. The part 10A of the output stage 10 is effectively turned off. If the 8 mA current drive enable line 61 is also disabled, i.e., logic "0", then the parts 10B and 10C are also disabled and the output stage 10 is a high impedance state. The output terminal 11 is electrically uncoupled.

When the output enable line 24 and the 4 mA enable line are both logic "1", the part 10A becomes conducting. The PMOS transistor 112 and NMOS transistor 106 are turned on, and the transistors 105 and 107 are turned off. The data transistors 108 and 109, in response to the data signal on the line 34, control the output driver transistors 100 and 101 and the level of the output signal at the terminal 11.

It should be noted that the NMOS transistor 106 and PMOS transistors 112, 110 and 114 are sized smaller than the data transistors 108 and 109. These smaller transistors are thus considerably more resistive when conducting. The result is that voltage on the gate electrode of the PMOS driver transistor 100 can rise quickly but fall slowly and the gate electrode of the NMOS driver transistor 101 can fall quickly but rise slowly. This design allows the very large output driver transistors 100 and 101 to turn off quickly and to turn on slowly. This avoids or considerably lessens the switching current through the two transistors 100 and 101 which results if both transistors are simultaneously conducting.

This design technique of using the transistor size differential to allow the large driver transistors of an output circuit to turn off quickly but to turn on slowly, also alleviates the problem of "ground bounce." Ground bounce is the term for the problem of transient voltage rises at an integrated circuit output lead at a low voltage state caused by the rapid switching of other output leads of the integrated circuit. Through the parasitic inductive coupling of the output leads of the integrated circuit and its package, these transient voltages, which are typically worse for switching from high to low voltages, may cause the local ground power supply of the integrated circuit to rise. This rise in ground raises the voltage levels of those output leads at a low level. If the rise is large enough, the voltage levels may be improperly sensed as being at a high voltage level. Ground bounce can also be caused by the simultaneous switching of the output driver transistors which pull the output terminal up and down in voltage.

However, a straightforward transistor size differential technique has some shortcomings. While the size of the transistors can be designed for a certain set of conditions so that the output driver transistors turn on slowly enough, variations in the conditions, such as temperature, supply voltages, and even processing of the integrated circuit, may render the operation of the output driver transistors too slow.

In the present invention the output stage 10 has feedback to optimize the switching operation of the output driver transistors 100 and 101 while avoiding ground bounce. The PMOS transistor 110, which has its gate electrode connected to the terminal 11, senses the voltage at the terminal. The lower the terminal 11 drops in voltage, the greater the transistor 110 turns on and the faster the gate electrode of the driver transistor 101 is pulled up. The PMOS transistor 101 turns on faster. This feedback provides for the terminal 11 to be pulled down faster as the rate of current increase reduces in magnitude. The output terminal 11 is discharged faster after the initial ground bounce spike has passed and results in less output buffer delay.

Besides the transistor size differentials, the output driver stage 10 also has another immunization measure against ground bounce. Each unit 10A–10C has driver control transistors 102 and 103. The NMOS driver control transistor 103 senses the local ground voltage, GND0, and provides feedback which tends to pull down the voltage on the gate electrode of the NMOS driver transistor 101 to reduce its conduction when GND0 rises due to ground bounce. This feedback operation is most active under conditions which result from a strong effect of the pulldown action of the transistor 101, i.e., a severe ground bounce. The transistor 103 operates as a clamp to shut off the driver transistor 101 as to limit the rise in GND0. The transistor 103 has little effect under conditions where switching is slower and ground bounce is not a problem. This allows the gate electrode of the NMOS driver transistor 101 to rise quickly and preserves the speed of the output stage 10.

It should be noted that the transistor 103 can operate because the two ground circuits, GND for the integrated circuit and its substrate, and GNDO for the output driver transistors, are electrically separated.

In a similar manner, the driver control transistor 102 provides "ground", or more strictly, power supply voltage, control for the PMOS driver transistor 100. The transistor 102 senses the local power supply voltage, $V_{CCO}$, and provides feedback to reduce the conduction of the driver transistor 100 when $V_{CCO}$ has dropped low compared to the integrated circuit's $V_{CC}$ power supply. This provides $V_{CC}$ bounce control, over a problem which is not faced as often as the ground bounce problem. Again it should be noted that transistor 102 operates because the two power supply circuits, for $V_{CC}$ and $V_{CCO}$, are electrically separated.

Finally, the unit 10A has the PMOS transistor 114 which is connected to the slew rate control signal line 76. When its gate electrode is driven low, the PMOS transistor 114 improves the coupling of the gate electrodes of the power transistors 100 and 101 to the source electrodes of the data transistors 109 and 108 respectively. This coupling speeds the voltage transitions at the terminal 11.

Figure 3:
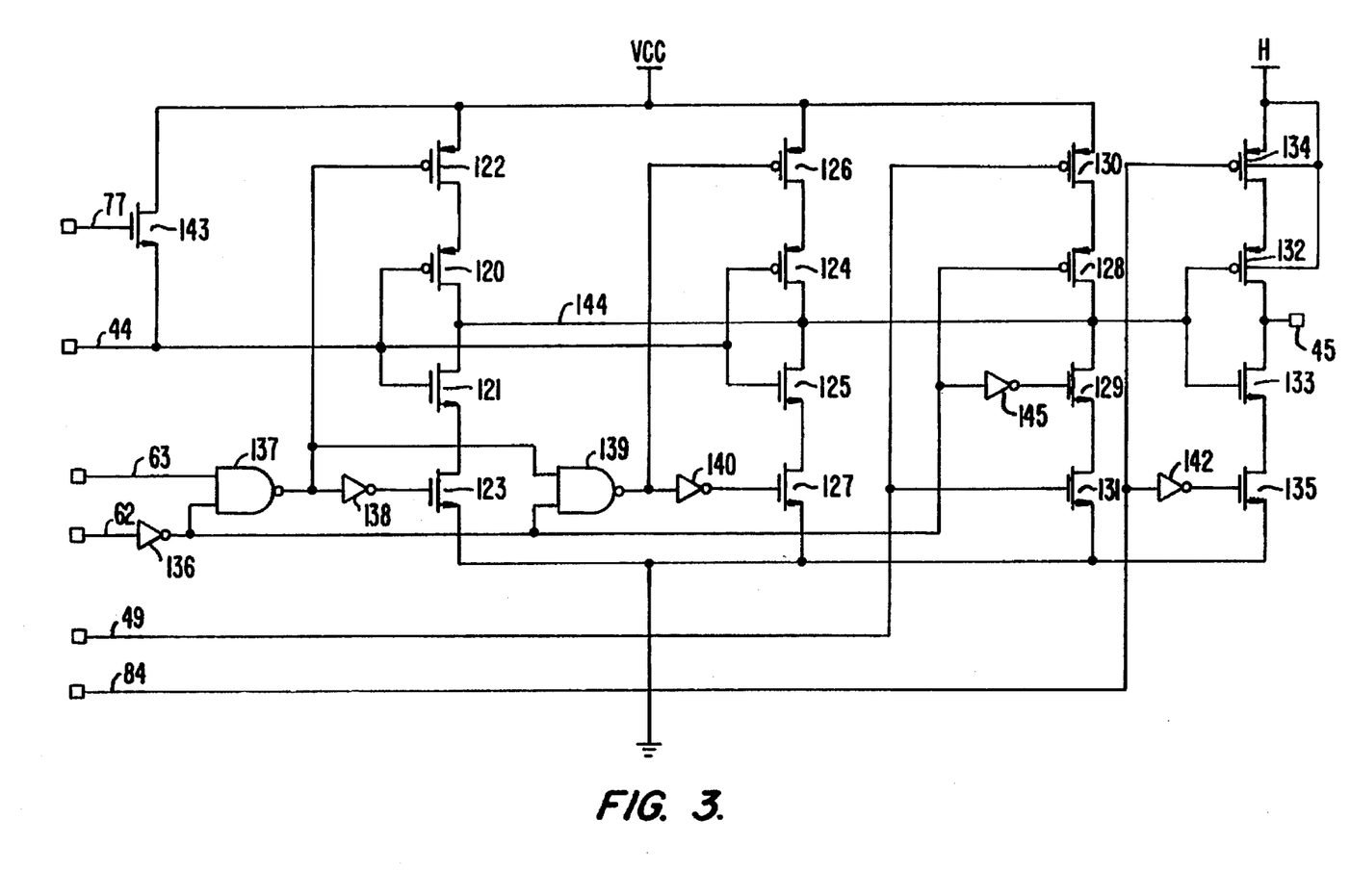
FIG. 3 is a circuit schematic diagram of a programmable multiplexer of FIG. 1.

FIG. 3 is the detailed circuit diagram of the multiplexer 43 of FIG. 1. The multiplexer 43 can be operated so that it can select data at different logic levels with no significant loss in speed. The multiplexer 43 has two data input terminals, the first connected to the output terminal of the latch 42 and the second connected to the input/output terminal 11 through the line 44. The multiplexer 43 also has four control terminals, each respectively connected to the control line 84, the control lines 62 and 63, and the control line 77, and an output terminal connected to the data input line 45 to the interior of the integrated circuit.

Four PMOS and NMOS transistors 120–123 in FIG. 3 function as a inverter with a high impedance state for input data signals which operate at TTL (transistor-transistor logic) levels on the line 44 from the terminal 11. The PMOS 122 transistor has its source connected to the $V_{CC}$ power supply and its drain electrode connected to the source of the PMOS transistor 120, which has its drain connected to the drain of the NMOS transistor 121. The NMOS transistors 121 has its source connected to the drain of the NMOS transistor 123 which, in turn, has its source connected to the ground power supply. The PMOS transistor 120 and NMOS transistor 121 have their gates commonly connected to the line 44. The transistors 120–123 are sized so that when the transistors 122 and 123 are turned on, as explained below, the inverter switches states at +1.4 volts as required by TTL circuits.

Likewise, four PMOS and NMOS transistors 124–127 function as a inverter with a high impedance state for input data signals which operate at CMOS (complementary metal-oxide-semiconductor) logic levels on the line 44 from the terminal 11. The PMOS 126 transistor has its source connected to the $V_{CC}$ power supply and its drain electrode connected to the source of the PMOS transistor 124, which has its drain connected to the drain of the NMOS transistor 125. The NMOS transistor 125 has its source connected to the drain of the NMOS transistor 127 which, in turn, has its source connected to the ground power supply. The PMOS transistor 124 and NMOS transistor 125 have their gates commonly connected to the line 44 (and gates of the transistors 120 and 121). The transistors 124–127 are sized so that when the high impedance state transistors 126 and 127 are turned on, as explained below, the inverter switches states at +2.5 volts as required by CMOS logic circuits.

Similarly a third inverter with a high impedance state is formed by four PMOS and NMOS transistors 128–131 in FIG. 3. The PMOS 130 transistor has its source connected to the $V_{CC}$ power supply and its drain electrode connected to the source of the PMOS transistor 128, which has its drain connected to the drain of the NMOS transistor 129. The NMOS transistors 129 has its source connected to the drain of the NMOS transistor 131 which, in turn, has its source connected to the ground power supply. The PMOS transistor 128 and NMOS transistor 129 have their gates commonly connected to the output terminal of the latch 42. The transistors 128–131 are sized to operate at full CMOS logic levels between 0 and +5 volts. When the high impedance state transistors 128 and 129 are turned on, as explained below, the inverter switches states at +2.5 volts.

A fourth set of four transistors 132–135 operate as a level-shifting output inverter having a high impedance state receiving the output signals of the previously described three inverters. The PMOS 134 transistor has its source connected to a power supply at +3.5 volts and its drain electrode connected to the source of the PMOS transistor 132, which has its drain connected to the drain of the NMOS transistor 133. The NMOS transistors 133 has its source connected to the drain of the NMOS transistor 135 which, in turn, has its source connected to the ground power supply. The PMOS transistor 132 and NMOS transistor 133 have their gates commonly connected to the output terminals of the previously described three inverters, i.e., the commonly connected drains of the transistors 120 and 121, 124 and 125, and 128 and 129.

It should be noted that the PMOS transistors 132 and 134 are placed in a N-well separated from the N-well in which the other PMOS transistors are placed. The N-well of the transistors 132 and 134 to be held at +3.5 volts compared to the +5 volts for the N-well of the other PMOS transistors. This permits the output inverter when enabled to generate signals at its output terminal, the commonly connected drains of the PMOS transistor 132 and NMOS transistor 133, between 0 and +3.5 volts. Thus the signals on the multiplexer's output terminal, which is connected to the line 45, are compatible with the voltage levels for the interior of the integrated circuit.

Inverters and NAND logic gates 136–141 decode the control signals on the control lines 62 and 63 to enable one of the first three inverters. The control line 62 is connected to the input terminal of the inverter 136 which has its output terminal connected to the gate of the PMOS transistor 128 and, through the inverter 141, the gate of the NMOS transistor 129. A logic "1" on the line 62 turns on the two transistors 128 and 129 so that the input transistors 130 and 131 which have their gates commonly connected to the data input terminal 145 become operative. The third inverter is enabled to pass signals from the line from the latch 42 to the output inverter and to the output terminal and the line 45.

If the signal on the control line 62 is a logic "0", then the third inverter is disabled and one of first two inverters are enabled responsive to the control signal on the control line 63. A NAND gate 137 has one of its two input terminals connected to the line 63; the other input terminal is connected to the output terminal of the inverter 136. The output terminal of the NAND gate 137 is directly connected to the gate of the PMOS transistor 122 and indirectly through the inverter 138 to the gate of the NMOS transistor 123.

A second NAND gate 139 has one of its two input terminals connected to the output terminal of the first NAND gate 137. The second input terminal is connected to the output terminal of the inverter 136. The output terminal of the NAND gate 139 is connected directly to the gate of the PMOS transistor 126 and, through an inverter 140, to the gate of the NMOS transistor 129.

Thus with a logic "0" on the line 62, a logic "1" on the control line 63 turns on the transistors 122 and 123 to enable the first inverter. The input transistors 120 and 121 which have their gates commonly connected to the data input line 44 become operative and the transistors 126 and 127 of the second inverter are turned off. A logic "0" on the control line 63 turns on the transistors 126 and 127 to enable the second inverter and the transistors 122 and 123 of the first inverter are turned off. The second inverter's input transistors 124 and 125 which have their gates commonly connected to the data input line 44 now become operative.

Before any of the output signals from the first, second or third inverters are passed to the output terminal 150, the output inverter must be enabled. A logic "0" on the control line 84 which is connected to the gate of the PMOS transistor 134 and to the gate of the NMOS transistor 135 through an inverter 142 enables the output inverter. If the control line 84 is at a logic "1," the transistors 134 and 135 are turned off and the output inverter is in a high impedance state.

The fourth control line 77 is connected to the gate of a NMOS transistor 143 which has its drain connected to the power supply at $V_{CC}$ and its source connected to data input line 44. A logic "1" on the control line 77 turns on the transistor 143 to provide a pullup for input/output terminal through the line 44. In other words, if left alone the input/output terminal 11 is pulled high toward $V_{CC}$. On the other hand, when enabled the transistor 143 operates weakly enough so that any signal on the terminal 11 easily overpowers the action of the transistor 143.

Figure 4:
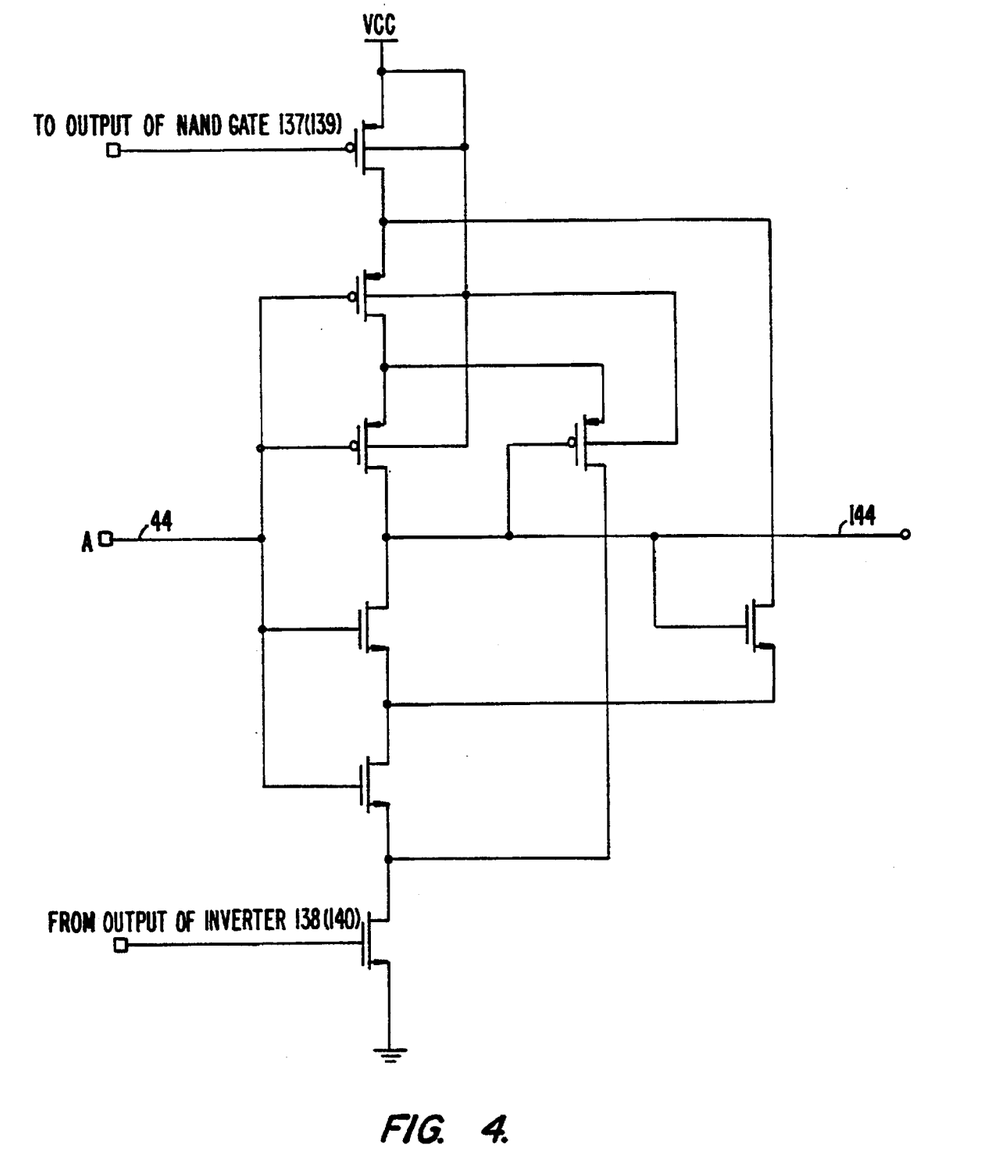
FIG. 4 is a schematic diagram of a Schmitt trigger circuit which may be used in the multiplexer in FIG. 3.

For input signals which are slow or sloppy, Schmitt triggers may be used in place of the inverters formed by the transistors 120–123 and 124–127 receiving the data signals from the terminal 11. The output signals of a Schmitt trigger have a sharp transition. FIG. 4 is a circuit schematic diagram of a typical Schmitt trigger implemented in CMOS technology. The input signal and output signal lines are labeled with same reference numbers as used in FIG. 3 along with the connections to the logic selecting the particular Schmitt trigger circuit. As stated above, the switching point of each Schmitt trigger circuit can be adjusted by appropriately designing the operating parameters of the transistors in the Schmitt trigger circuit. Thus one Schmitt trigger circuit can receive TTL logic signals and the other CMOS logic signals.

Figure 5:
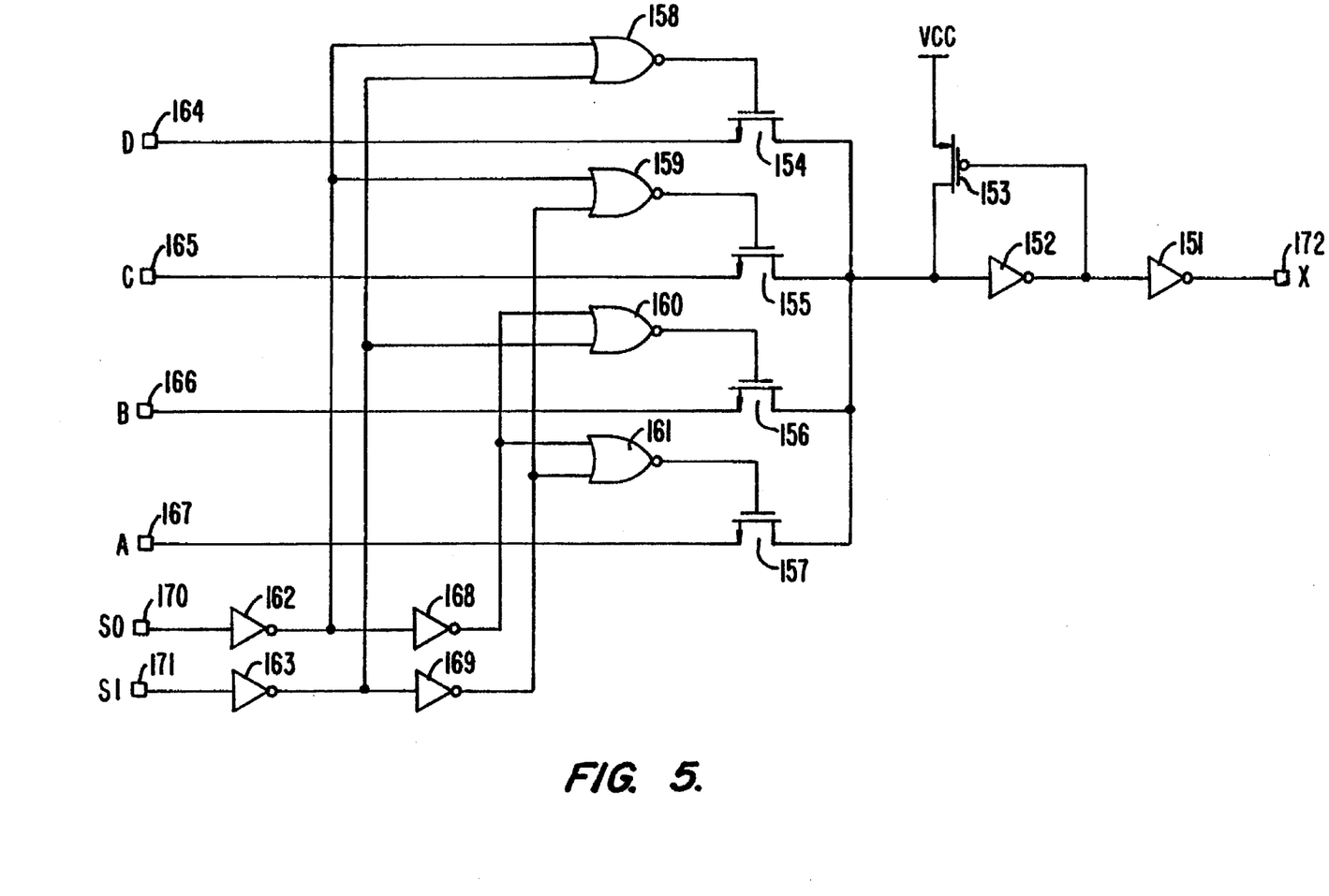
FIG. 5 is a circuit schematic diagram of another level-shifting multiplexer of FIG. 1.

FIG. 5 is a detailed circuit diagram of the 4-to-1 multiplexers 20, 30 and 40 of FIG. 1. These multiplexers 20, 30 and 40 perform the dual functions of multiplexing and level-shifting with no substantial loss in speed. Each of the multiplexers has four input data terminals 164–167, an output data terminal 172, and two control terminals 170 and 171. Control signals on the two terminals 170 and 171 selects which of the input data terminals 164–167 is connected to the output terminal 172.

The four input data terminals 164–167 are connected respectively to a source/drain electrode of four NMOS transistors 154–157. The other source/drain electrode of each of the transistors 154–157 are connected in common to the input terminal of a inverter 152. The output terminal of the inverter 152 is connected to the input terminal of a second inverter 151, which has its output terminal connected to the output terminal 172 of the multiplexer. Also connected to the input terminal of the inverter 152 is the drain electrode of a PMOS transistor 153, which has its source electrode connected to the power supply terminal at $V_{CC}$. The gate electrode of the transistor 153 is connected to the output terminal of the inverter 152.

Each of the two control signal terminals 170 and 171 are respectively connected to two inverters in series. The terminal 170 is connected to the input terminal of an inverter 162 which has an output terminal connected to the input terminal of a second inverter 168. The terminal 171 is connected to the input terminal of an inverter 163 which has an output terminal connected to the input terminal of a second inverter 169.

The gate electrode of each of the four NMOS transistors 154–157 are respectively connected to the output terminals of four NOR logic gates 158–161. Each of the logic gates 158–161 have two input terminals which are connected to the output terminals of the inverters 162, 163, 168 and 169. The input terminals of the logic gates 158–161 are connected so that only one of the logic gates generates a logic "1" to turn on one of the NMOS transistors 154–157 at a time. With one of the NMOS transistors 154–157 turned on, one of the corresponding data signal input terminals 164–167 is connected to the output terminal 172 through the inverters 152 and 151.

The combination of connections to the output terminals of the inverters 162, 163, 168 and 169 provides the basis for the multiplexing operation by the control signals at the terminals 170 and 171. For example, with two logic "1"'s on the terminals 170 and 171, the NOR gate 158 generates a "1" output signal to turn on its NMOS transistor 154; the other logic gates 159–161 generate output "0" signals. Because of its connections to output terminals of the inverters 162 and 163, only the NOR gate 158 receives "0" signals at its input terminals. The other NOR gates 159–161 are connected to other combinations of inverter output terminals. With different control signals at the terminals 170 and 171, the other NOR gates 159–161 are selected to turn on their respective NMOS transistors 155–157.

The multiplexer shown in FIG. 5 also shifts the voltage levels of the data input signals. As noted previously, the interior of the integrated circuit operates between 0 to +3.5 volts. Thus most of the data signals at the terminals 164–167 operate in a range from 0 to +3.5 volts (along with the output signals from the NOR logic gates 158–161). When one of the terminals 164–167 is selected by turning on the corresponding one of the NMOS transistors 154–157, which have a threshold voltage of approximately 1 volt, the data signal from the terminal ranges from 0 to +2.5 volts at the input terminal to the inverter 152. Of course, the input data signal can range from 0 to +5 volts without changing the operation of the multiplexers 20, 30 and 40.

The inverter 152, which operates between power supplies at 0 volts (ground) and +5 volts ($V_{CC}$), has an approximate switching point of +1.25 volts, midpoint in the range of voltages passed by the NMOS transistors 154–157 to the inverter's input terminal. The switching point is determined by the design of the transistors which form the inverter 152, as is commonly done by integrated circuit designers. The inverter's output signal switches between 0 and +5 volts. This signal in turn is switched by the second inverter 151, which also operates between 0 and +5 volts fully between the two power supply voltages.

The PMOS transistor 153 has its drain electrode and gate electrode respectively connected to the input terminal and output terminal of the inverter 152. When the data signal at the input terminal of the inverter 152 switches from zero to high, the transistor 153 helps pull up the voltage at the inverter's input terminal to increase the switching speed.

The transistor 153 acts as a weak pull-up so that when the data signal switches low, the action of the transistor 153 is easily overpowered by the data signal to switch the inverter 152.

This design allows the multiplexing and level-shifting functions to be integrated. The operational speeds of the multiplexers 20, 30 and 40 are optimized.

Figure 6:
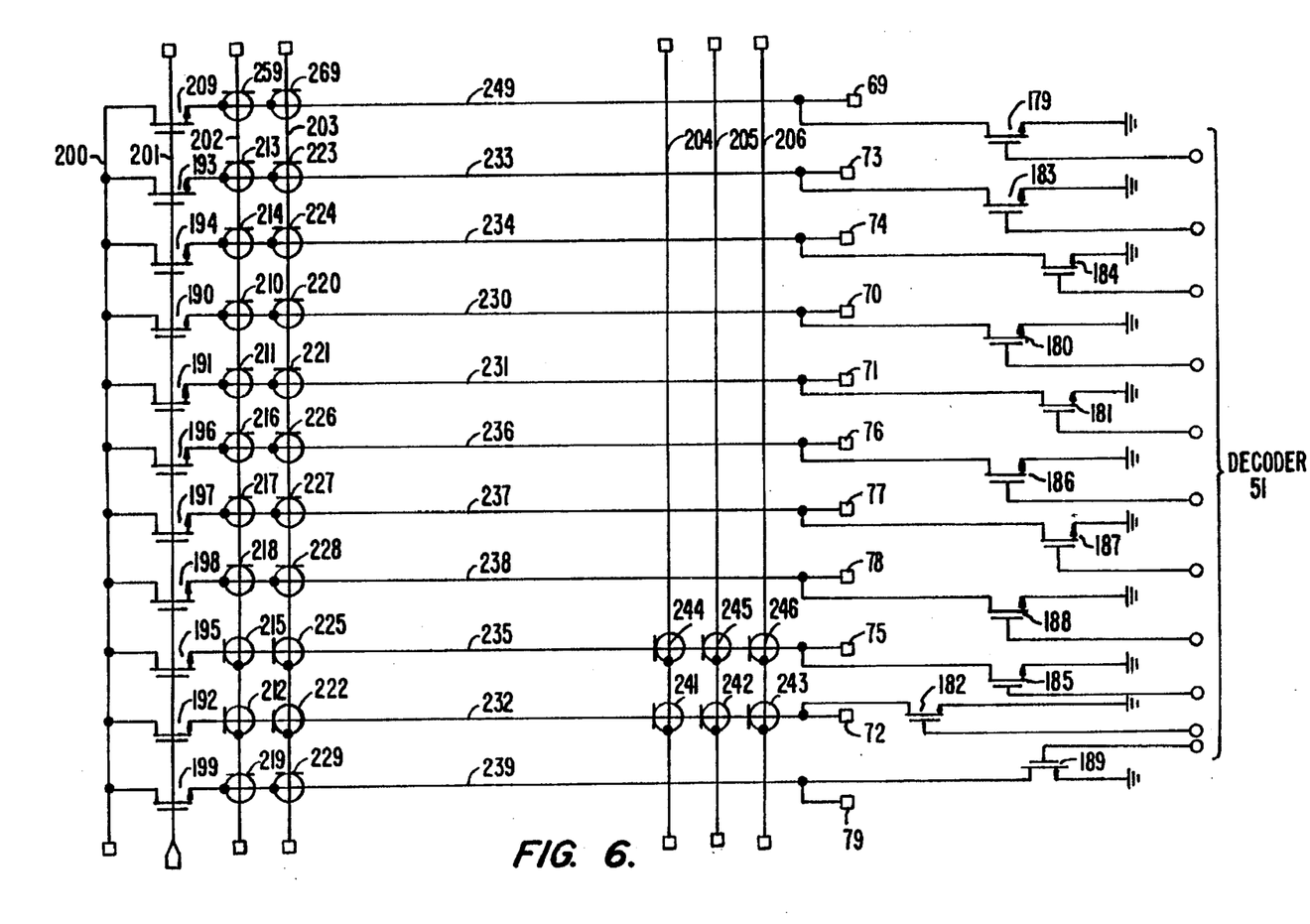
FIG. 6 is a circuit schematic diagram of the programming unit of FIG. 1.

FIG. 6 illustrates the details of the programming unit 50. The output terminals of the unit 50 are labeled with the reference numbers of the control lines 69–79 to which each of the output terminals are connected as shown in FIG. 1. Each of the output terminals 69–79 are respectively connected to one of several programming lines 230–239 and 249. Each of the lines 230–239 and 249 are connected to the source/drains of NMOS transistors 180–189 and 179 respectively. The other source/drains of the transistors 179–189 are connected to ground. The gates of the transistors are connected to 11 address lines from the decoder 51. Each of the lines 230–239 and 249 are also connected to the source/drains of NMOS transistors 190–199 and 209 respectively, which have their other source/drains connected to a precharge programming line 200. The gates of each of the transistors 190–199 are commonly connected to a precharge control line 201.

Intersecting each of the lines 230–239 and 249 are two control lines 202,203 and three clock lines 204–206. At the intersection of each programming line 230–239 and 249 and the control line 202 are antifuses 210–219 and 259. In the drawings antifuses are symbolized by a circle and a bar. Furthermore, antifuses 220–229 and 269 are located at the intersection of each programming line 230–239 and 249 and the control line 203. The programming line 232 also has antifuses 241–243 at its intersection with the clock lines 204–206 and the programming line 235 has antifuses 244–246 at its intersection with the clock lines 204–206.

Programming of the unit 50 is performed by connecting the 230–239 and 249 and the terminals 70–79 and 69 (and their control lines) to the control line 202, which is normally in a logic high state, to the control line 203, which is normally in a logic low state, and to the clock lines 204–206, which carry different timing signals. Connection is made by programming or "blowing" the antifuse at the intersection between the conducting line and the control or clock line.

Antifuse programming is performed by first placing all the programming lines 230–239 and 249 into a precharge state. Through a signal on the control line 201, all the transistors 190–199 and 209 are turned on to connect the lines 230–239 and 249 to the precharge control line 200. The line 200, at +5 volts, charges all the lines 230–239 and 249 to this voltage. Then the transistors 190–199 and 209 are turned off.

To program a selected antifuse, say, the antifuse 227, a large voltage, 10 volts in this case, is placed across the targeted antifuse. Through the operation of the decoder 51 the transistor 187 is turned on to ground the line 237. At the same time, through other decoder circuitry the control line 203 is raised to a special programming voltage of +10 volts. (The decoder circuitry and circuits for generating the programming voltage are not shown in the drawings. One skilled in the integrated circuit design would know to design decoder and programming voltage circuits.) With 10 volts across the antifuse 227, the antifuse is programmed and the line 237 is connected to the control line 203 in the low logic state. With the other lines 230–236, 238–239 and 249 precharged to an intermediate voltage of +5 volts, the antifuses at the intersections of these lines do not experience the large programming voltage of 10 volts and hence remain unprogrammed. In this manner the control lines 230–239 and 249 are set to a high logic state, i.e., connection to the control line 202, or to a low logic state, i.e., connection to the control line 203.

The conducting lines 232 and 235 may also be connected to the clock signal lines 204–206 by programming the antifuses 241–246. These antifuses are programmed in same manner as described above. In this case, however, the clock lines 204–206 are raised to the programming voltage.

In this manner the programming unit can set the operation of the input/output buffer circuit. For example, the control line 69 can be set low by programming the antifuse 269. By programming one of the antifuses 244–246, the control line 75 carries a clock signal so that the output driver stage 10 is periodically enabled. The terminal 11 is periodically pulled low; otherwise the terminal 11 is part of an open circuit. Note that the output driver stage 10 can be completely enabled or disabled by programming the antifuses 215 or 225 to set the control line 75 high or low.

The structure of the particular antifuse used is disclosed in U.S. Ser. No. 07/672,501, entitled "IMPROVED METHOD OF FABRICATING ANTIFUSES IN AN INTEGRATED CIRCUIT DEVICE AND RESULTING STRUCTURE," filed Mar. 20, 1991 by Pankaj Dixit et al. and assigned to the present assignee. However, it should be evident to persons skilled in integrated circuit design that other antifuses with different operational parameters, or other types of electrically programmable elements, such as floating gate MOS transistors, may be used in the input/output buffer circuit of the present invention.

For the convenient testing of the integrated circuit of which the input/output buffers are a part, the present invention has large test pads which are placed at a corner of the integrated circuit die. With a scan-based technique for testing, such as the IEEE 1149.1, this clustering of test pads in one corner of the integrated circuit die permits easy probing of the integrated circuit. Registration and alignment of the test probes are easier, especially for integrated circuits having a large number of pins.

Figure 9:
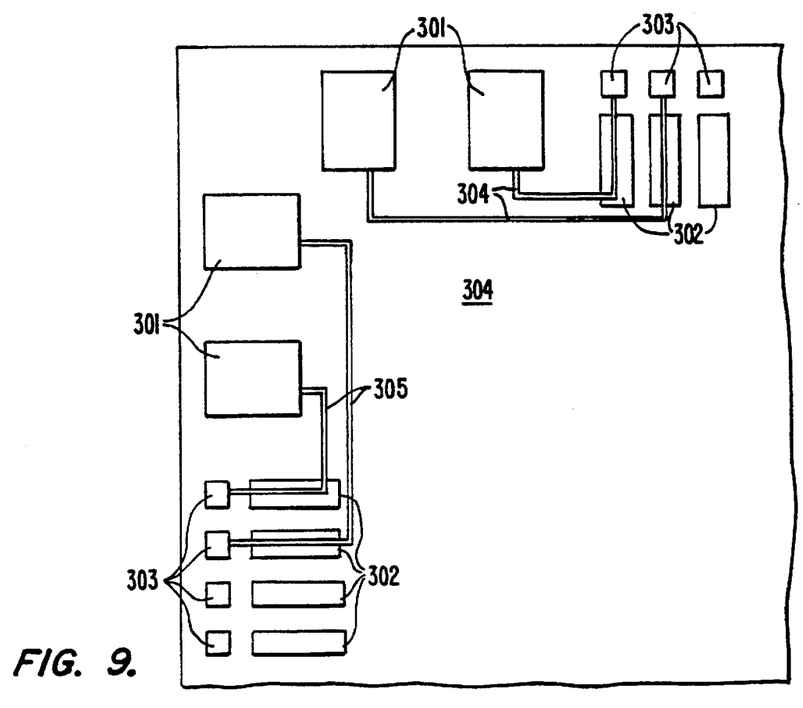
FIG. 9 illustrates a test pad arrangement according to the present invention.

As shown in FIG. 9, bonding pads 303 are placed along the sides of the die away from the corners, as in standard practice. Die corners are typically not used because of likelihood of cracking during scribing operations. The bonding pads 303 are the terminals for the input/output buffer circuits represented by rectangles 302 and for power circuits ($V_{CC}$ and ground). The pads 303 provide locations where various bonds, such as wire or tab, are made for leads for connections to the external system.

The test pads 301, which are at least one-and-half times larger than the bonding pads 303, are located in a corner 304 of the die and spaced apart for ease of testing and probing. These test pads 301 can be placed in other locations which are typically proscribed for bonding pads, such as the center of the die, or on or in close proximity to the scribe lines. These test pads are used during wafer testing of the dice in the wafer before scribing is performed. On the other hand, the bonding pads 303 are packed for maximum usage of the tab or other interconnection techniques. Each of the test pads 301 corresponds to one of the power bonding pads and to one of the bonding pads 303 for the IEEE 1149.1 serial scan test, i.e., the bonding pads for TDI, TDO, TMS, and TCK. Each test pad 301 is connected to its corresponding bonding pad 303 by a metal interconnection line 305.

When a probe contacts a test pad 301, the probe also makes electrical contact with the corresponding bonding pad 303 and connected input/output circuit (or power circuit). Thus with six probes, for TDO, TDI, TMS, TCK, power and ground, the integrated circuit can be tested by serial scanning without any contact to the bonding pads 303 of the integrated circuit. As stated above, the testing of each integrated circuit occurs when the integrated circuit is still part of a wafer. Yet no probe scores a bonding pad, which may damage the bonding pad and render the integrated circuit damaged by the process of testing. Of course, these test pads 301 may be used for other serial scan testing techniques.

While the above is a complete description of the preferred embodiments of the invention, various alternatives, modifications and equivalents may be used. It should be evident that the present invention is equally applicable by making appropriate modifications to the embodiments described above. For example, while the invention has been described in terms of CMOS technology, the present invention can be applied to other technologies, including bipolar and BiCMOS processes. Therefore, the above description should not be taken as limiting the scope of the invention which is defined by the metes and bounds of the appended claims.

What is claimed is:

1. A CMOS circuit for driving a signal on an input terminal onto an output terminal, said circuit comprising:
   a first pair of complementary transistors, a first transistor of said first pair having a gate electrode, a source electrode connected to a first voltage supply at a nominal first voltage, a drain electrode connected to said output terminal, a second transistor of said first pair having a gate electrode, a source electrode connected to a second voltage supply at a nominal second voltage, a drain electrode connected to said output terminal;
   a second pair of complementary transistors for alternately turning one of said transistors of said first pair on at a time responsive to a signal on said input terminal, a first transistor of said second pair having a source electrode connected to a third voltage supply, a gate electrode to said input terminal and a drain electrode connected to said gate electrode of said first transistor of said first pair, a second transistor of said second pair having a source electrode connected to a fourth voltage supply, a gate electrode connected to said input terminal and a drain electrode connected to said gate electrode of said second transistor of said first pair, said third power supply at said nominal first voltage but not electrically connected to said first power supply, said fourth power supply at said nominal second voltage but not electrically connected to said second power supply; and
   a third transistor having a source electrode connected to said gate electrode of said second transistor of said first pair, a drain electrode connected to said fourth voltage supply and a gate electrode connected to said source electrode of said second transistor of said first pair;
   whereby said output terminal is substantially immune from voltage spikes in said second voltage supply.

2. The CMOS circuit as in claim 1 further comprising a fourth transistor having a source electrode connected to said third voltage supply, a drain electrode connected to said gate electrode of said first transistor of said first pair and a gate electrode connected to said source electrode of said first transistor of said first pair whereby said circuit is substantially immunized from voltage spikes in said first voltage supply.

3. A CMOS circuit for driving a signal on an input terminal onto an output terminal, said circuit comprising:
   a first pair of complementary transistors, a first transistor of said first pair having a gate electrode, a source electrode connected to a first voltage supply at a nominal first voltage, a drain electrode connected to said output terminal, a second transistor of said first pair having a gate electrode, a source electrode connected to a second voltage supply at a nominal second voltage, a drain electrode connected to said output terminal;
   means connected to said input terminal and to said gate electrodes of said transistors of said first pair for alternately turning one of said transistors of said first pair on at a time responsive to a signal on said input terminal, said means coupled between a third and fourth power supply, said third power supply at said nominal first voltage but not electrically connected to said first power supply, said fourth power supply at said nominal second voltage but not electrically connected to said second power supply; and
   a third transistor having a source electrode connected to said gate electrode of said second transistor of said first pair, a drain electrode connected to said fourth voltage supply and a gate electrode connected to said source electrode of said second transistor of said first pair;
   wherein said means comprises
      a second pair of complementary transistors, a first transistor of said second pair having a source electrode connected to said third voltage supply, a gate electrode to said input terminal and a drain electrode connected to said gate electrode of said first transistor of said first pair, a second transistor of said second pair having a source electrode connected to said fourth voltage supply, a gate electrode connected to said input terminal and a drain electrode connected to said gate electrode of said second transistor of said first pair;
      a third pair of complementary transistors, a first transistor of said third pair having a source electrode connected to said third voltage supply, a drain electrode connected to said gate electrode of said first transistor of said first pair and a gate electrode coupled to a first control terminal, a second transistor of said third pair having a source electrode connected to said fourth voltage supply, a drain electrode connected to said gate electrode of said second transistor of said first pair and a gate electrode coupled to said first control terminal; and
      at least one transistor having source and drain electrodes connected between said gate electrode of said first transistor of said first pair and said gate electrode of said second transistor of said first pair, and a gate electrode coupled to said first control terminal, said gate electrodes of said transistors of said third pair and said gate electrode of said at least one transistor coupled to said first control terminal so that said transistors of said third pair are on when said at least one transistor is off to disable said CMOS circuit, and off when said at least one transistor is on to enable said CMOS circuit;
   whereby said output terminal is substantially immune from voltage spikes in said second voltage supply.

4. The CMOS circuit as in claim 3 further comprising a fourth transistor having a source electrode connected to said third voltage supply, a drain electrode connected to said gate electrode of said first transistor of said first pair and a gate electrode connected to said source electrode of said first transistor of said first pair whereby said circuit is substantially immunized from voltage spikes in said first voltage supply.

5. The CMOS circuit as in claim 3 further comprising:
a fourth pair of transistors, said transistors of said fourth pair having a same conductivity and connected in series between said gate electrode of said first transistor of said first pair and said gate electrode of said second transistor of said first pair, a first transistor of said fourth pair having a gate electrode coupled to said first control terminal so as to operate as said at least one transistor, and a second transistor of said fourth pair having a gate electrode connected to said output terminal;

whereby said second transistor of said fourth pair substantially speeds a transition of said output terminal from a high voltage state to a low voltage state.

6. The CMOS circuit as in claim 3 further comprising:
a fourth pair of transistors, said transistors of said fourth pair having a same conductivity and connected in series between said gate electrode of said first transistor of said first pair and said gate electrode of said second transistor of said first pair, a first transistor of said fourth pair having a gate electrode coupled to said first control terminal so as to operate as said at least one transistor, and a second transistor of said fourth pair having a gate electrode connected to a second control terminal;

whereby said second transistor of said fourth pair substantially speeds a transition of said output terminal from a high voltage state to a low voltage state responsive to a signal on said second control terminal.

7. A CMOS circuit for driving a signal on an input terminal onto an output terminal, said circuit comprising:
a plurality of units, each unit connected in parallel to said input terminal and to said output terminal, each unit having
a control terminal;
means connected to said control terminal for enabling said each unit responsive to a signal on said control terminal; and
means for driving a signal on said input terminal onto said output terminal with a predetermined drive current, said predetermined drive current being determined by each unit;

wherein said driving means of each unit comprises a first pair of complementary transistors, said transistors of said first pair connected in series between first and second nominal supply voltages, said transistors having gate electrodes of said transistors coupled to said input terminal and a commonly connected drain electrode connected to said output terminal, each transistor sized to provide said predetermined drive current through said output terminal when said transistor is conducting;

wherein said enabling means comprises
a second pair of complementary transistors, a first transistor of said second pair having a source electrode connected to a voltage supply at said first nominal voltage, a drain electrode connected to said gate electrode of said first transistor of said first pair and a gate electrode coupled to said control terminal, a second transistor of said second pair having a source electrode connected to a voltage supply at said second nominal voltage, a drain electrode connected to said gate electrode of said second transistor of said first pair and a gate electrode coupled to said control terminal; and
a third transistor having source and drain electrodes coupled between said gate electrode of said first transistor of said first pair and said gate electrode of said second transistor of said first pair, and a gate electrode coupled to said control terminal, said gate electrodes of said transistors of said second pair and said gate electrode of said third transistor coupled to said control terminal so that said transistors of said second pair are on when said third transistor is off to disable said CMOS circuit, and off when said third transistor is on to enable said CMOS circuit;

whereby said circuit drives signals onto said output terminal with selective drive currents responsive to signals on said unit control terminals.

8. The CMOS circuit as in claim 7 further comprising a first immunizing transistor having a source electrode connected to said gate electrode of said second transistor of said first pair, a drain electrode connected to said voltage supply at said second nominal voltage and a gate electrode connected to said source electrode of said second transistor of said first pair, and wherein said source electrode of said second transistor of said first pair is connected to a second voltage supply at said second nominal supply voltage, said second voltage supply electrically disconnected from voltage supply at said second nominal supply voltage;

whereby said output terminal is substantially immune from voltage spikes in said second voltage supply at said second nominal supply voltage.

9. The CMOS circuit as in claim 8 further comprising a second immunizing transistor having a source electrode connected to said voltage supply at said first nominal supply voltage, a drain electrode connected to said gate electrode of said first transistor of said first pair and a gate electrode connected to said source electrode of said first transistor of said first pair and wherein said source electrode of said first transistor of said first pair is connected to a second voltage supply at said first nominal supply voltage, said second voltage supply electrically disconnected from said supply voltage at said first nominal supply voltage;

whereby said output terminal is substantially immunized from voltage spikes in said second voltage supply at said first nominal supply voltage.

10. The CMOS circuit as in claim 7 further comprising:
a third pair of complementary transistors, a first transistor of said third pair having a source electrode connected to said voltage supply at said first nominal voltage, a gate electrode connected to said, input terminal and a drain electrode connected to said gate electrode of said first transistor of said first pair, a second transistor of said third pair having a source electrode connected to said voltage supply at said second nominal voltage, a gate electrode connected to said input terminal and a drain electrode connected to a gate electrode of said second transistor of said first pair; and
a fourth transistor having source and drain electrodes coupled between said gate electrodes of said first and second transistors of said first pair, and a gate electrode connected to a second control terminal;

whereby said fourth transistor substantially speeds a transition of said output terminal from a high voltage state to a low voltage state responsive to a signal on said second control terminal.

11. The CMOS circuit as in claim 10 further comprising a fifth transistor connected in series with said third transistor between said gate electrodes of said first and second transistors of said first pair, said fifth transistor having a gate electrode connected to a control terminal of a selected unit whereby operation of said third transistor is enabled by a signal on said control terminal of said selected unit.

12. The CMOS circuit as in claim 10 further comprising a sixth transistor connected in series with said fourth transistor between said gate electrodes of said first and second transistors of said first pair, said sixth transistor having a gate electrode connected to said output terminal whereby said sixth transistor substantially speeds a transition of said output terminal from a high voltage state to a low voltage state.

* * * * *